United States Patent [19]

Oppelt et al.

[11] Patent Number: 4,733,186
[45] Date of Patent: Mar. 22, 1988

[54] METHOD FOR THE OPERATION OF A NUCLEAR MAGNETIC RESONANCE APPARATUS FOR THE FAST IDENTIFICATION OF THE LONGITUDINAL RELAXATION TIME $T_1$

[75] Inventors: Arnulf Oppelt, Spardorf; Rainer Graumann, Hoechstadt, both of Fed. Rep. of Germany

[73] Assignee: Siemens Aktiengesellschaft, Berlin and Munich, Fed. Rep. of Germany

[21] Appl. No.: 917,603

[22] Filed: Oct. 10, 1986

[30] Foreign Application Priority Data

Oct. 29, 1985 [DE] Fed. Rep. of Germany ....... 3538464

[51] Int. Cl.⁴ .......................................... G01R 33/20
[52] U.S. Cl. ..................................... 324/309; 324/307
[58] Field of Search ............... 324/300, 306, 307, 309, 324/311, 312, 313; 128/653

[56] References Cited

U.S. PATENT DOCUMENTS

| | | | |
|---|---|---|---|
| 4,383,219 | 5/1983 | Kaplan | 324/309 |
| 4,480,228 | 10/1984 | Bottomley | 324/309 |
| 4,532,473 | 7/1985 | Wehrli | 324/309 |
| 4,558,277 | 12/1985 | Post et al. | 324/309 |
| 4,587,489 | 5/1986 | Wehrli | 324/309 |

FOREIGN PATENT DOCUMENTS 0137420 9/1984 European Pat. Off. .
0135847 9/1984 European Pat. Off. .

OTHER PUBLICATIONS

"NMR Imaging in Medicine", Pykett, Scientific American, vol. 246, No. 5, May 1982, pp. 54–64.
"Instrumentation for NMR Spin-Wrap Imaging", Johnson et al, 8056 J. Phys. E. Sci. Instr., vol. 15, No. 1, Jan. 1982, pp. 74–79.
"Signal, Noise, & Contrast in Nuclear Magnetic Resonance (NMR) Imaging", Edelstein et al, J. Compt. Assist. Tomogr., vol. 7, No. 3, Jun. 1983, pp. 391–401.

Primary Examiner—Michael J. Tokar
Attorney, Agent, or Firm—Hill, Van Santen, Steadman & Simpson

[57] ABSTRACT

A method for the operation of a nuclear magnetic resonance apparatus excites the spin system of an examination subject by applying a fundamental magnetic field as well as by irradiation with a sequence of radio-frequency pulses and the nuclear magnetic resonance signals emitted by the spin system are measured. The chronological development of the longitudinal magnetization of the spin system can be tracked by a sequence of partial read pulses each having a flip angle of less than 90° and thus a fast identification of the longitudinal relaxation time $T_1$ can be achieved. In combination with applied gradient fields, the method can be applied in imaging nuclear magnetic resonance tomography.

9 Claims, 3 Drawing Figures

METHOD FOR THE OPERATION OF A NUCLEAR MAGNETIC RESONANCE APPARATUS FOR THE FAST IDENTIFICATION OF THE LONGITUDINAL RELAXATION TIME $T_1$

BACKGROUND OF THE INVENTION

1. Field of the Invention

The invention relates to a method for the operation of a nuclear magnetic resonance apparatus wherein the spin system of an examination subject is excited by applying a fundamental magnetic field as well as by irradiation with sequences of radio-frequency pulses and the nuclear magnetic resonance signals emitted by the spin system are measured.

2. Description of the Prior Art

Measurements of the longitudinal relaxation time $T_1$ in conventional NMR systems have been exactly realized only using extremely long measuring times. Known methods, for instance the inversion recovery method or the saturation recovery method described in "Scientific American", Vol. 246, No. 5, May 1982, pp. 54–64, are chronologically protracted measuring methods because, after an excitation of the spin system, these methods always identify only one point of the relaxation curve $M_z(t)$, for example, by exposures having different repetition time $T_R$ or inversion time I.

SUMMARY OF THE INVENTION

An object of the invention is to provide a method for the operation of a nuclear magnetic resonance apparatus with which the longitudinal relaxation time $T_1$ of the spin system to be investigated can be identified in a significantly shorter measuring time.

This object is achieved in accordance with the principles of the present invention wherein the chronological development of the spin system is measured by partial read pulses whose chronological spacing is small in comparison to the longitudinal relaxation time $T_1$.

Measuring a point of the longitudinal relaxation curve $M_z(t)$ with the assistance of the known inversion recovery method is achieved by means of the following steps:

The magnetization of the spin system is brought into an exactly defined initial status. The system is then allowed to relax during a selectable time I (inversion time). The longitudinal magnetization present after the time I is read out by means of one-time "tilting" into the X-Y plane with a 90° pulse, being read out with reference to the following nuclear magnetic resonance signal. This pulse represents such a great disturbance on the magnetization condition that the spin system must first be brought into a precisely defined starting condition again in order to measuring the next relaxation point and the inversion time I must be marked off again.

In the method of the invention, by contrast, the disturbance of the magnetization condition due to the partial read pulses having a small flip angle is less after the initial magnetization has been produced. The respectively prevailing longitudinal magnetization is rotated into the X-Y plane only fractionally and the measuring procedure therefor only slightly changes the longitudinal magnetization. A repeated acquisition of the relaxation curve during the relaxation event is therefore possible. This means a considerable time saving because one does not have to wait every time until the spin system proceeds into a defined starting condition.

DESCRIPTION OF THE PREFERRED EMBODIMENTS

Figure 1:
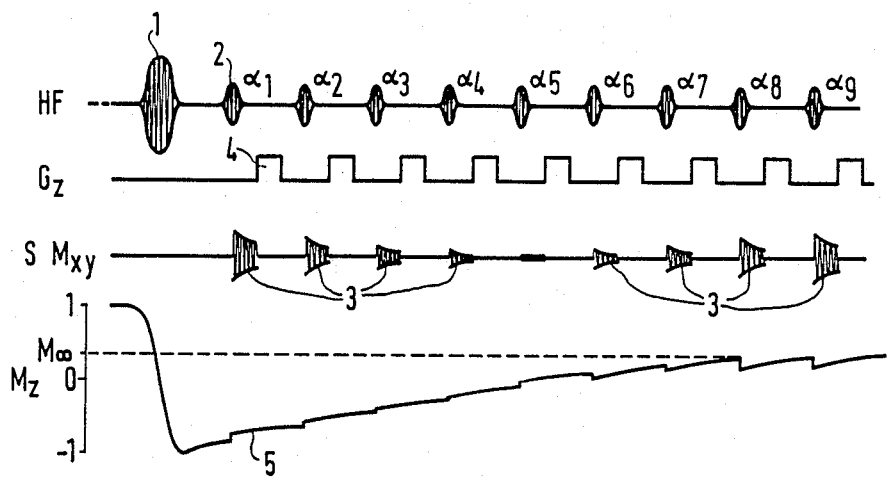
FIG. 1 is a graphical showing of a pulse sequence, resonance signals, and longitudinal magnetization for a method of the invention for fast $T_1$ measurement.

FIG. 1 schematically shows the chronological curve of the pulse sequences generated by the radio-frequency and gradient means of a nuclear magnetic resonance apparatus in accordance with the method of the invention. In this exemplary embodiment, the magnetization of the spin system is first inverted by a radio-frequency pulse 1. A 180° pulse, the "adiabatic fast passage" method or a special selective radio-frequency pulse described by Silver ("Selective Population Inversion in NMR", Nature 310, pp. 681–683, August 1984) can be employed for this purpose. A number of radio-frequency pulses 2 (typically 8–64) having a flip angle less than 90°, referred to below as partial read pulses, are then applied. After every partial read pulse 2, the nuclear magnetic resonance signal 3 excited as a result thereof is read out and, subsequently, the remaining transverse magnetization is destroyed by a z-gradient spoiler pulse 4.

The partial read pulses 2 exhibit flip angles $\alpha_i$ which typically lie between 5° and 20°. The spacing of the partial read pulses is set in accordance with the ratio of the anticipated longitudinal relaxation time to the plurality of RF pulses.

An inversion of the nuclear magnetization due to the inversion pulse 1 is generally not required. Also coming into consideration as part of the start magnetization condition is saturation, i.e., the amount of transverse magnetization, or thermal equilibrium magnetization in the magnetic field before application of the partial read pulses. When the fraction of this starting value in the overall magnetization of the nuclear ensemble to be measured is referenced $M_o$ (given complete inversion, thus, $M_o = -1$), the partial read pulses 2 follow equidistantly in the chronological spacing $\Delta t$ and when they flip the nuclear magnetization by the flip angle $\alpha$, the longitudinal magnetization 5 at point in time $t_n = n \cdot \Delta t$ immediately before the $n^{th}$ partial read-out pulse as a fraction $M_n$ of the overall magnetization is derived as follows:

$$M_n = 1 + \frac{1 - \cos\alpha}{\cos\alpha e^{-\Delta t/T_1} - 1} e^{-\frac{\Delta t}{T_1}} - \cos^{n-1}\alpha \cdot F \qquad [1]$$

whereby, $$F = \left\{ 1 + \frac{1 - \cos\alpha}{\cos\alpha e^{-t/T_1} - 1} - M_o \cos\alpha \right\} e^{-n\Delta t/T_1}.$$

The longitudinal magnetization 5 thus changes exponentially with the time constant $T_1$, the longitudinal relaxation time to be identified, toward a "steady state" value $$M_\infty = \frac{1 - e^{-\Delta t/T_1}}{1 - \cos\alpha\, e^{-\Delta t/T_1}}$$

The nuclear magnetic resonance signal 3 read out after the partial read pulses directly mirror the momentary longitudinal magnetization $M_n$:

$$S_n = M_n \sin\alpha$$

The longitudinal relaxation time $T_1$ can be identified from the totality of all read out resonance signals 3 by means of the following mathematical adaptation method. The equation [1] is brought into the following form by conversion and logarithmization:

$$\ln(M_n - C_1) = \ln C_2 - \ln\cos\alpha + n\left(\ln\cos\alpha - \frac{\Delta t}{T_1}\right),$$

with the constants $C_1$ and $C_2$ independent of n as follows:

$$C_1 = \frac{1 + 1 - \cos\alpha}{\cos\alpha\, e^{-\Delta t/T_1} - 1} e^{-\Delta t/T_1}$$

$$C_2 = -\left(1 + \frac{1 - \cos\alpha}{\cos\alpha\, e^{-\Delta t/T_1} - 1} - M_0\cos\alpha\right).$$

In a mathematical adaptation calculation, the constant $C_1$ is varied as a free parameter C until the points $\ln(M_n - C)$ lie on a straight line. From the straight slope m defined therefrom and from the constant C, the longitudinal relaxation time $T_1$ can be calculated in the following way without knowledge of the rotational angle $\alpha$:

$$T_1 = -\frac{\Delta t}{\ln(C(e^m - 1) + 1)}$$

In order to avoid the time necessary for the mathematical adaptation calculation, the longitudinal relaxation time $T_1$ can be taken directly from a table previously produced with the assistance of equation [1], being taken therefrom from the zeroaxis crossing of the measured signals and given a rough knowledge of the rotational angle $\alpha$. This enables an identification of the longitudinal relaxation time $T_1$ at a speed not matched by any other method.

For the employment of the fast and precise method disclosed herein for the identification of the longitudinal relaxation time in imaging nuclear magnetic resonance tomography, suitable imaging gradients must be applied after the partial read pulses 2 and the nuclear magnetic resonance signal must be read out. The methods for this are known in the art.

Figure 2:
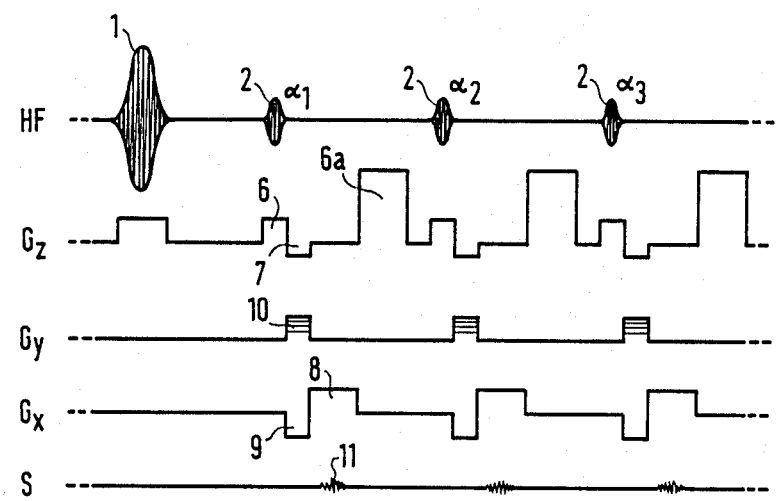
FIG. 2 is a graphical showing of a pulse sequence and resonance signals for a method of the invention for topically resolved, fast $T_1$ measurement in imaging nuclear magnetic resonance tomography.

FIG. 2 shows a possibility of employing the method of the invention in nuclear magnetic resonance tomography, whereby the two-dimensional Fourier reconstruction method is utilized.

For slice selection, the partial read pulses 2 are made selective, i.e., a slice selection gradient $G_z 6$ is switched on at the same time. After the selective partial read pulses 2, the nuclear magnetization in the re-polarized slice selection gradient $-G_z 7$ is re-phased and is subsequently read out in the projection gradient $G_x 8$. In order to displace the chronological zero point of the read out signal 11 into the middle of the read out time, a prior de-phasing of the nuclear magnetization in the re-polarized projection gradient $-G_x 9$ is recommended. A coding gradient $G_y 10$ is also effective before the signal read out. Spoiler gradient follow in order to destroy the remaining transverse magnetization. For this purpose, for example, the slice selection gradient $G_z$ is again applied with such a duration and amplitude that the time integral of this gradient pulse 6a becomes noticably greater (roughly 10 times) than the corresponding integral at the point in time of the partial read pulse 2. The gradient pulse 6a is therefore shown in the drawing too small in terms of scale.

Figure 3:
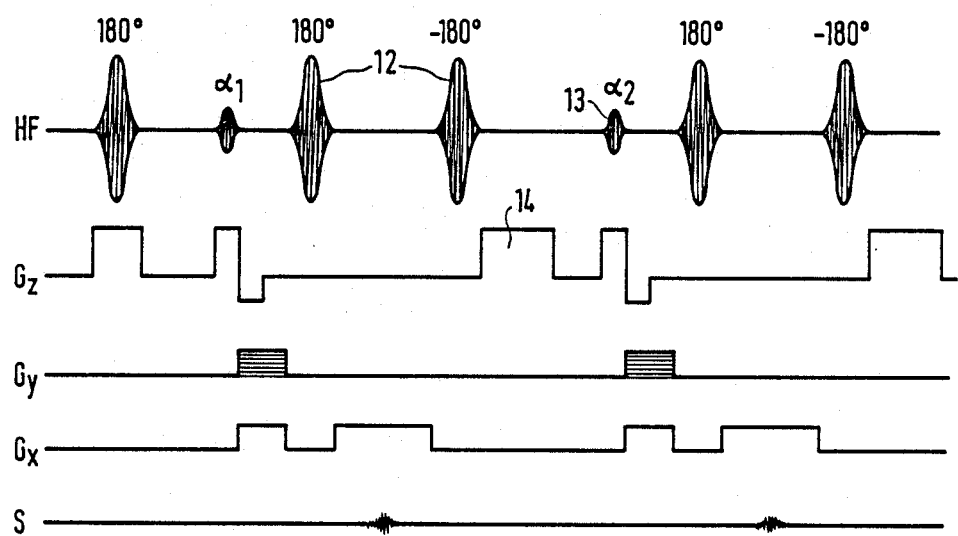
FIG. 3 is a graphical showing of a pulse sequence and resonance signals for a method of the invention for topically resolved, fast $T_1$ measurement given non-uniform magnetic fields.

FIG. 3 shows an application of the method of the invention in nuclear magnetic resonance tomography given nonuniform magnetic fields. Given non-uniform magnetic fields, it is preferable to work with echoes generated by $\pm 180°$ RF-pulses 12 instead of working with the previously described gradient echoes 11. The pulse sequence is applied such that the 180° pulses always appear in pairs and anti-phase, so that no saturation of the nuclear ensemble occurs. The transverse magnetization still present before application of the next partial read pulse 13 is again eliminated by a gradient spoiler pulse 14.

In this way, a number n of differently $T_1$-weighted projections are obtained. In order to be able to calculate an identical number of differently $T_1$-weighted images therefrom, the sequence carried out for the measurement of the projections must be repeatedly done (typically 256 times) with different projection directions or different coding. Producing the totality of n $T_1$-weighted images, however, does not last longer than that of an individual image.

By comparing the intensity of corresponding image elements (pixels) from such a $T_1$ image series, the longitudinal relaxation process at a location corresponding to the pixel can be examined and not only can the longitudinal relaxation time be precisely identified but also this can be analyzed as though, for instance, a plurality of relaxation decays having different time constants were present. This is the case, for example, given "partial volume" effects when, for instance, fat and water are present in the same picture element.

Although modifications and changes may be suggested by those skilled in the art it is the intention of the inventors to embody within the patent warranted hereon all changes and modifications as reasonably and properly come within the scope of their contribution to the art.

We claim as our invention:

1. A method for operating a nuclear magnetic resonance apparatus in which an examination subject is disposed comprising the steps of:
   generating a fundamental magnetic field in which said examination subject is disposed;
   exciting a spin system in said examination subject by a sequence of RF pulses for generating nuclear magnetic resonance signals and measuring said nuclear magnetic resonance signals, said sequence of RF pulses being formed by a plurality of partial read pulses having respective flip angles of less than 90°, with a chronological spacing between successive partial read pulses being less that the longitudinal relaxation time of said spin system, and one pulse preceding said partial read pulses for placing said spin system in a selected start magnetization condition and;

reading out the nuclear magnetic resonance signal after every partial read pulse.

2. A method as claimed in claim 1, wherein said spin system has a thermal equilibrium magnetization $M_z$, and wherein said one pulse is an inversion pulse having a flip angle of 180° for setting said start magnetization condition to $-M_z$.

3. A method as claimed in claim 1, comprising the additional step of cancelling said start magnetization condition by applying a saturation pulse to said spin system.

4. A method as claimed in claim 1, comprising the additional step of:

applying a gradient spoiler pulse to said spin system after each partial read pulse for cancelling the cross-magnetization of said spin system.

5. A method as claimed in claim 1, comprising the additional steps of:

generating an adaptation equation which identifies the longitudinal relaxation time in terms of the momentary longitudinal magnetization of said spin system; and calculating said longitudinal relaxation time with each measurement of said momentary longitudinal magnetization.

6. A method as claimed in claim 1, wherein the rotational angle of said spin system is approximately known, and comprising the additional steps of:

generating a table which includes a plurality of entries generated by varying a constant for different values of the longitudinal relaxation time and the rotational angle by varying the rotational angle, such that each entry in said library is a point lying on a straight line; and calculating the longitudinal relaxation time from said constant and the slope of said straight line.

7. A method as claimed in claim 1, comprising the additional steps of:

applying a selected plurality of selection gradients during said partial read pulses; and applying selected imaging gradients during read out of said nuclear magnetic resonance signals for obtaining projections of said examination subject which are longitudinal relaxation time-weighted in accordance with the position of said RF pulses.

8. A method as claimed in claim 1, comprising the additional steps of:

applying a 180° RF pulse and a $-180°$ RF pulse beween two successive partial read pulses; and applying selected imaging gradients during read out of said nuclear magnetic resonance signals for obtaining projections of said examination subject which are longitudinal relaxation time-weighted in accordance with the RF pulse position for influencing the effect of field inhomogenities on the quality of the image of said examination subject.

9. A method as claimed in claim 7, comprising the additional step of:

reconstructing an image of said examination subject from the totality of said projections with the longitudinal relaxation time being calculated for every image point in said image.

* * * * *